United States Patent
Frücht

(10) Patent No.: US 10,983,169 B2
(45) Date of Patent: Apr. 20, 2021

(54) CYCLE TEST METHOD

(71) Applicant: Eaton Intelligent Power Limited, Dublin (IE)

(72) Inventor: Johannes Frücht, Soest-Amp (DE)

(73) Assignee: Eaton Intelligent Power Limited, Dublin (IE)

( * ) Notice: Subject to any disclaimer, the term of this patent is extended or adjusted under 35 U.S.C. 154(b) by 17 days.

(21) Appl. No.: 15/779,280

(22) PCT Filed: Oct. 24, 2016

(86) PCT No.: PCT/EP2016/075520
§ 371 (c)(1),
(2) Date: May 25, 2018

(87) PCT Pub. No.: WO2017/089051
PCT Pub. Date: Jun. 1, 2017

(65) Prior Publication Data
US 2018/0348306 A1    Dec. 6, 2018

(30) Foreign Application Priority Data
Nov. 27, 2015 (DE) .......................... 102015015324.2

(51) Int. Cl.
*G01R 31/385* (2019.01)
*H01M 10/44* (2006.01)
(Continued)

(52) U.S. Cl.
CPC ........ *G01R 31/385* (2019.01); *H01M 10/441* (2013.01); *H01M 10/482* (2013.01);
(Continued)

(58) Field of Classification Search
None
See application file for complete search history.

(56) References Cited

U.S. PATENT DOCUMENTS 4,302,714 A * 11/1981 Yefsky ............... G01R 31/3648
320/131
4,692,682 A * 9/1987 Lane ..................... H02J 7/0091
320/152

(Continued)

FOREIGN PATENT DOCUMENTS

EP   0537651    4/1993
EP   2947969    11/2015
(Continued)

OTHER PUBLICATIONS

Machine translation of EP2947969A1 (Year: 2019).*
(Continued)

*Primary Examiner* — David V Henze-Gongola
(74) *Attorney, Agent, or Firm* — Pearne & Gordon LLP

(57) ABSTRACT

The invention relates to a cycle test method for at least one rechargeable battery (1) having, in particular, a single-battery emergency lamp (2) as a load, wherein the battery (1) is connected to a supply device (3) for charging/discharging at the location of use, comprising the following steps:

i) charging the battery (1) by means of the supply device (3);
ii) interrupting the charging for a time, in particular a specified time, in order to lower the temperature of the battery (1);
iii) discharging the battery (1) to a specified remaining voltage value; and
iv) performing steps i) to iii) multiple times.

15 Claims, 2 Drawing Sheets

(51) Int. Cl.
*H01M 10/48* (2006.01)
*H02J 7/00* (2006.01)
*H05B 47/10* (2020.01)
*H02J 9/02* (2006.01)

(52) U.S. Cl.
CPC ....... *H01M 10/486* (2013.01); *H01M 10/488* (2013.01); *H02J 7/0069* (2020.01); *H02J 7/0091* (2013.01); *H05B 47/10* (2020.01); *H01M 10/443* (2013.01); *H02J 9/02* (2013.01)

(56) References Cited

U.S. PATENT DOCUMENTS

| | | | |
|---|---|---|---|
| 4,952,862 A * | 8/1990 | Biagetti | G01R 31/3648 320/132 |
| 5,777,453 A | 7/1998 | Imanaga | |
| 2004/0113591 A1 * | 6/2004 | Bradley | H02J 7/0086 320/133 |
| 2005/0088100 A1 | 4/2005 | Chen et al. | |
| 2005/0225299 A1 | 10/2005 | Petrovic | |
| 2008/0180064 A1 * | 7/2008 | Miki | H02J 7/1461 320/136 |
| 2009/0051326 A1 * | 2/2009 | Wang | H02J 7/0031 320/154 |
| 2011/0037438 A1 | 2/2011 | Bhardwaj et al. | |

FOREIGN PATENT DOCUMENTS

| | | |
|---|---|---|
| EP | 2947969 A1 * | 11/2015 |
| GB | 2359426 | 8/2001 |

OTHER PUBLICATIONS

Topalov, Angel, International Search Report issued in PCT/EP2016/075520, completion date Dec. 8, 2016, dated Dec. 16, 2016, 4 pages, European Patent Office, Rijswik, Netherlands, with translation 3 pages.

Translation of EP2947969, via LexisNexis Total Patents, May 24, 2018, 9pages.

Translation of EP0537651, via LexisNexis Total Patents, May 24, 2018, 4 pages.

Singapore Search Report and Written Opinion issued in application No. 11201804475U, dated Feb. 21, 2019, pp. 11.

Cheung, T. K. et al., Maintenance techniques for rechargeable battery using pulse charging. 2nd International Conference on Power Electronics Systems and Applications, Nov. 14, 2006, pp. 205-208.

* cited by examiner

CYCLE TEST METHOD

PRIORITY CLAIM

The present application is a national phase application of and claims priority to International Application No. PCT/EP2016/075520 with an international filing date of Oct. 24, 2016, which claims priority to German Patent Application No. 10 2015 015 324.2, filed Nov. 27, 2015. The foregoing applications are hereby incorporated herein by reference.

TECHNICAL FIELD

The invention relates to a cycle test method for at least one rechargeable battery.

BACKGROUND

Such a battery may be, for example, a NiCD battery, a NiMH or lithium ion battery. Other batteries are likewise possible. Such batteries are used, for example, for single-battery emergency lamps which may be part of a corresponding emergency lighting system. The respective lamp has as light fixture one or more fluorescent tubes, LEDs or similar, where appropriate also in a modular design.

At the location of use, i.e. close to the corresponding load, the battery is connected to a supply device in order to charge the battery.

SUMMARY

In order to optimize the capacity of the different batteries/battery types it is expedient to form the batteries at the first start-up. This forming is achieved by multiple charging/discharging cycles. In this connection the battery is charged to 100% and then discharged to the cutoff voltage. The subject of the invention is the automation of the formation.

During the deployment, in a first step i) the battery is charged to 100% by means of the supply device.

Subsequently, in a step ii) the charging is interrupted for a time, in particular a specified time, in order to lower the temperature of the battery. During the charging, a certain part of the supplied power is generally converted into heat, which is drawn off again in this way.

After interruption of the charging for the predetermined time, in a step iii) discharging of the battery to the cutoff voltage takes place. Subsequently, the preceding steps i) to iii) of charging, interrupting the charging, and discharging are repeated, i.e. carried out several times.

By means of this cycle test method a new battery is formed and the capacity of the battery is optimized.

The battery is monitored at all times. In the case of NiCd and NiMH cells, charging takes place with a constant current as a function of the battery temperature. In addition, the maximum charging voltage is monitored. After 100% of the capacity has been charged, the system switches over to maintenance charging, in order to compensate for the self-discharging of the cells. In the case of lithium batteries, charging takes place up to a maximum charging voltage and subsequently the charging is completely switched off. The charging is again switched on when the voltage of the lithium battery falls below a certain value and the capacity has fallen below a specific value which could endanger the duration of the emergency lighting.

Due to the cycle test method a corresponding battery can often be regenerated to the extent that the capacity thereof provides a required duration of the emergency lighting for a corresponding load.

According to the invention the possibility exists of arranging the battery in a separate housing and connecting this housing to the load in particular in an explosion-proof manner. In other words, the battery and corresponding housing can be used in areas at risk of explosion. The corresponding contact between housing and load can take place, for example, by means of Ex-d plug contacts or similar.

Moreover, alternatively or also additionally the supply device can be designed with the necessary explosion protection. In other words, the supply device can also be used in areas at risk of explosion and like the battery, can be replaced as required with the housing.

Different numbers of different battery types can generally be used for corresponding single-battery emergency lamps or the like as load. According to the invention this is taken into account in that, in particular, before step i) the number of batteries and/or battery types is detected. This detection is generally carried out by through the supply device, so that different numbers of batteries or also different types can be charged or discharged only by one supply device and can likewise be subjected to the cycle test method.

In this connection, furthermore, the possibility exists that battery parameters are recorded and/or monitored. This can take place in particular before, during or also after the steps of the cycle test method. In other words, the supply device will record the history of the battery and, by means of the corresponding battery parameters, will be able to ascertain whether the battery is in a critical situation with regard to its use, in particular, for a single-battery emergency lamp.

Such a critical situation occurs, for example, when an emergency supply time of the load through the battery is less than a predetermined emergency supply minimum time. In the case of NiCd batteries this can happen, for example, when a so-called memory effect occurs or when, for a relatively long time, batteries have not been discharged or have been discharged only to the cutoff voltage. In such a case the corresponding steps of the cycle test method can be carried out after detection of this insufficient emergency supply time. In other words, by the cycle test method attempts are made to regenerate the battery again to such an extent that it can be used for emergency supply.

The corresponding "self-healing" of the battery is achieved by discharging the battery to the cutoff voltage. In order to protect the corresponding batteries, the circuit has a redundant deep discharge protection, which reliably prevents destruction of the batteries by a discharge below the cutoff voltage.

According to the invention the corresponding cycle of the test method is carried out several times for a predetermined number of times. Then, if a corresponding emergency supply minimum time is again reached by the battery after the end of the cycle test method, the battery is switched over to reuse for supplying the load in normal operation. In other words, the battery again reaches the necessary discharge time and thus the emergency supply minimum time and the corresponding critical situation is eliminated. The normal operation of the load and, in particular, of the single-battery emergency lamp can be resumed.

The possibility may exist that, after the cycle test method has been carried out once, a corresponding emergency supply minimum time of the battery is not yet provided. In this case the cycle test method can be carried out once more or even multiple times. However, if no improvement takes place even after the cycle test method has been carried out multiple times, an error message can be output by means of, for example, a display device of the supply device. In this way the user is notified of the malfunction of the battery.

In this case, in particular, such an error message can be displayed if, after the corresponding steps of the cycle test method, at least one battery parameter lies outside a predetermined range. This can likewise be ascertained by the supply device.

The corresponding cycle test method for forming the battery should only be initiated if the mains voltage was uninterruptedly present for a certain time period. In other words, it should not yet be carried out if, during a development phase of an emergency lighting system, the mains voltage is repeatedly switched off, i.e. interrupted. Such switching off of the mains voltage should not serve to initiate the cycle test method according to the invention. One possibility for such a predetermined time is, for example an uninterrupted supply with mains voltage for two, three or more days.

The corresponding supply device of the battery can have different components. In an advantageous exemplary embodiment the supply device is designed, for example, with a charging unit for the battery and/or a processor and/or a constant current source and/or a display device and/or a battery monitor and the like.

The charging, discharging, monitoring and storage of all battery parameters and the like can be carried out by these different components of the supply device.

The supply device can then carry out a cycle test if, for example, with a fully charged battery in the emergency lighting mode a supply of the corresponding load for the predetermined emergency supply minimum time is no longer guaranteed.

Furthermore, the possibility exists of forming the supply device also for corresponding supply of the connected load; see in this connection, for example, an electronic ballast for a phosphor lamp or a LED module.

Likewise, the possibility exists that the supply device and the electronic ballast are separate components.

The corresponding cycle is controlled by the processor of the supply device. In other words, the processor also, for example, monitors the charging of the battery by means of a corresponding constant current from the constant current source.

A simple possibility for charging is capacity-dependent charging. In the case of such charging, it is possible for charging to full battery capacity to take place, in particular having regard to a charging factor of the battery. Such a charging factor corresponds to the reciprocal of a charging efficiency factor. The charging efficiency factor corresponds to the ratio of the withdrawn capacity to the supplied capacity. The charging factors are known for different battery types. For example, the charging factor for NiCd batteries is approximately 1.4 and for NiMH batteries is approximately 1.2.

Moreover, the approximate charging time of the battery can be determined with the aid of the charging factor, the charging current and the maximum charge quantity.

During the discharging, the battery can be discharged, in particular, by means of the load. In this case, furthermore, it may be advantageous if, during the discharge, a separation of the mains voltage from the electronic ballast for supplying a phosphor lamp or a LED module as load takes place and supplying of the electronic ballast by means of, in particular, a push-pull converter takes place from the battery.

Such a push-pull converter is a circuit which converts an electric d.c. voltage into a different electric d.c. voltage.

BRIEF DESCRIPTION OF THE FIGURES

An advantageous embodiment of the invention is explained in greater detail below with reference to the appended drawings.

In the drawings.

DETAILED DESCRIPTION OF EXAMPLE EMBODIMENTS

Figure 1:
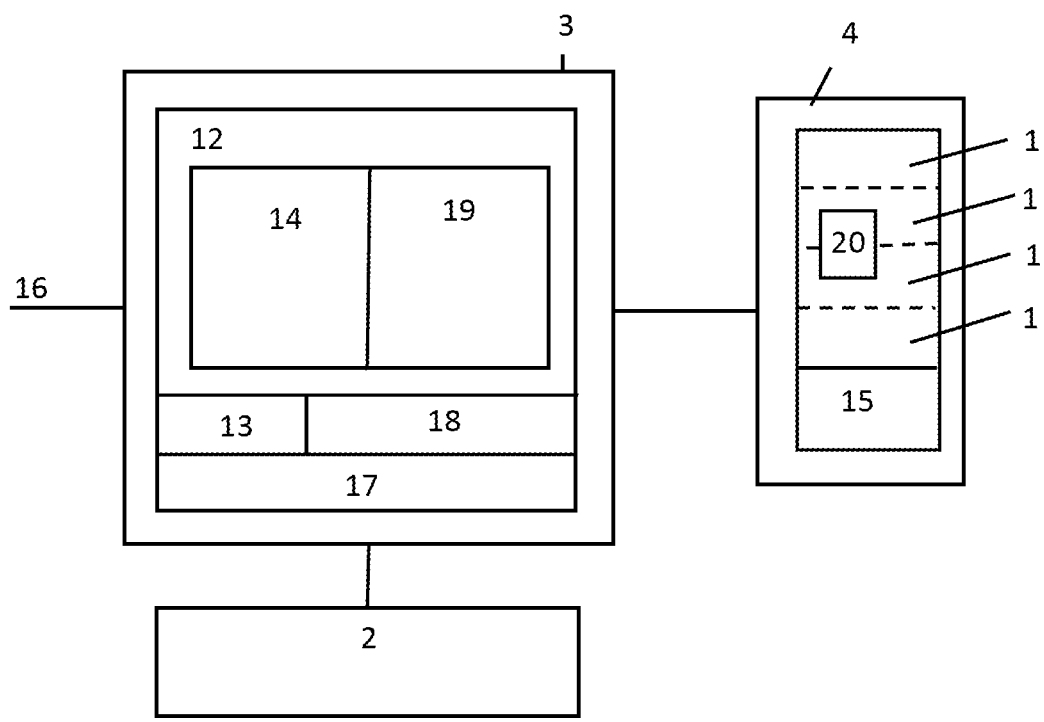
FIG. 1 shows a simplified basic representation of a circuit for carrying out the cycle test method and FIG. 2 shows graphs of current, voltage and temperature, in particular during the cycle test method.

FIG. 1 shows a highly simplified sketch of a corresponding circuit arrangement for carrying out the cycle test method according to the invention. The circuit comprises at least one rechargeable battery 1 or also a plurality of rechargeable batteries. The battery or batteries 1 are arranged in a housing 4, in which a display device 15 is optionally also integrated. This can be connected to a supply unit 3 in a lamp by means of corresponding explosion-proof contacts, for example according to explosion protection type Ex-d. The corresponding connection makes it possible that even in areas at risk of explosion, for example, the housing 4 with the batteries can be replaced, in particular, without switching off of the mains voltage 16. The battery or batteries 1 are connected to a supply device 3. The battery can be charged and monitored thereby. In particular, such charging, discharging and monitoring takes place during the cycle test method according to the invention.

In the illustrated exemplary embodiment the supply device 3 has various components. A component is, for example, a charging device 12, which carries out the charging of the respective battery 1 from the mains voltage 16. Furthermore, the supply device 3 has a battery monitor 19, a constant current source 14 and a processor 13. The charging of the respective battery 1 by means of the charging device 12 from the constant current source 14 can be monitored by the processor 13. Moreover, the processor 13 can likewise control and monitor the discharging of the respective battery 1, in particular by means of the load 2 and, optionally the electronic ballast 17. The charging of the respective battery takes place depending upon the capacity. The load 2 may be an emergency lamp which has, for example, a phosphor lamp, a LED module or the like as the light fixture. In this connection the electronic ballast 17 optionally serves for activation of the light fixture.

Furthermore, a temperature measuring device 20 can be associated at least with the battery 1, in order to by means of the supply device 3 and in particular of the processor 13 to carry out charging or discharging of the battery as a function of the charging current, charging voltage and temperature.

Likewise, the possibility exists that, in particular, the processor 13 is arranged as a separate component which in this case, for example, monitors not only the supply device 3 and the battery 1, but also the load 2 and electronic ballast 17 with push-pull converter 18.

Figure 2:
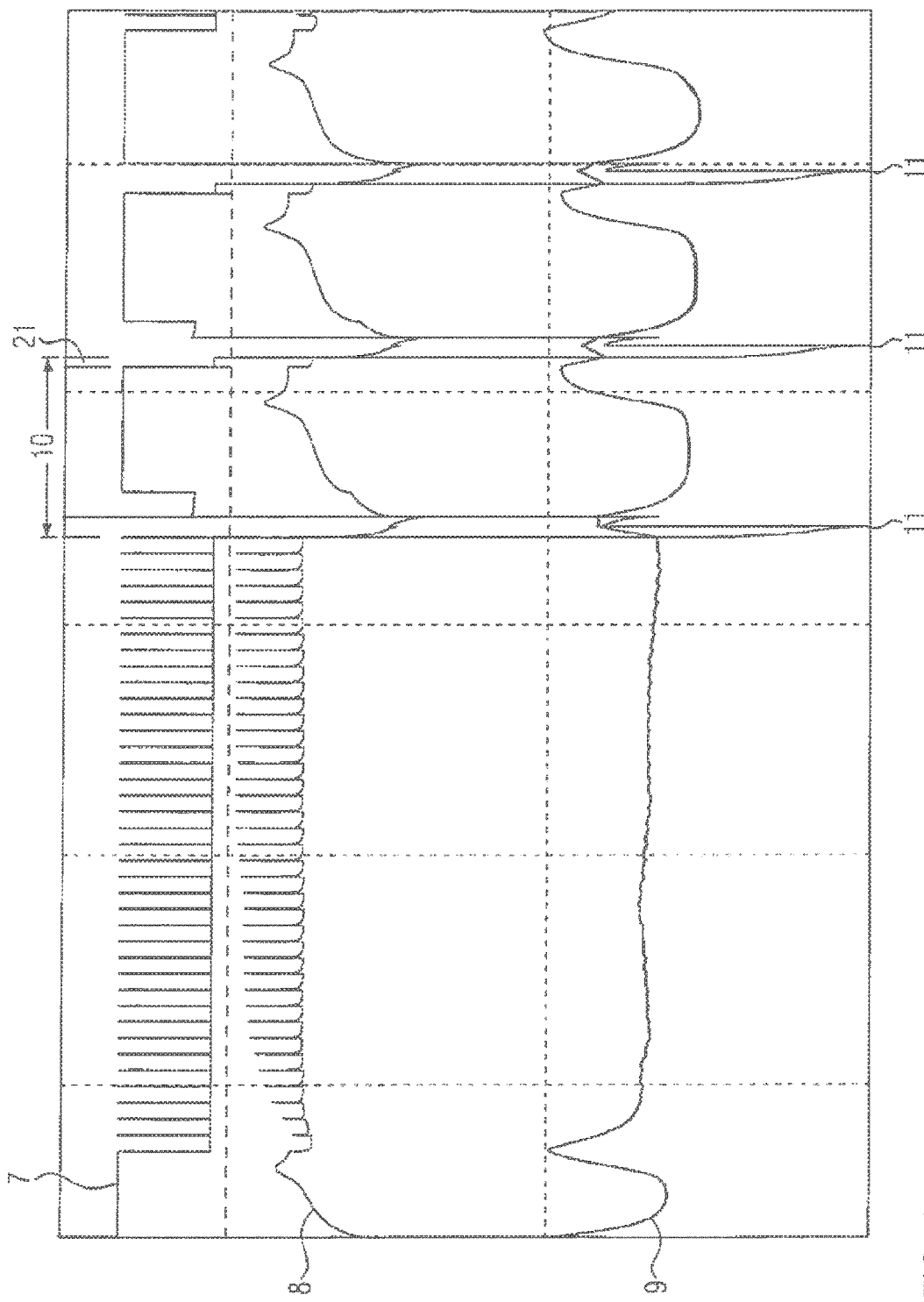

FIG. 2 shows different diagrams for current 7, voltage 8 and temperature 9 both before the cycle test method according to the invention is carried out and also during, for example, three cycles, see cycle 10.

The temperature 9 increases at the start in the case of complete charging of the battery to an increased temperature, which then drops to a substantially constant temperature.

A first cycle is run through after the battery is shown by monitoring of the supply device to have an impermissible value in a battery parameter. In this case the cycle in takes place at the first start-up, after the mains voltage has been applied to the supply unit for a certain time. For initiation of the cycle 10, first of all charging of the battery takes place by means of the supply device. The charging takes place, in particular, by means of a constant current and as a function of the capacity. The charging continues to take place up to complete capacity. Following the charging, an interruption 21 of the charging takes place for a predetermined time and then discharging takes place, in particular to deep discharge. Following this the cycle is carried out again, see charging, interruption of the charging, and discharging to deep discharge 11. Such a cycle 10 can be carried out two, three or even more times in succession. If at the end of the cycle test method it is ascertained that a corresponding "self-healing" of the battery has taken place, a switching back to normal operation takes place and the battery is used again in the emergency lighting system.

During the cycle test, current 7, voltage 8, and temperature 9 are monitored. This is preferably carried out by the supply device 3 and in particular by means of the processor 13 thereof. Moreover, for charging and discharging the supply device has a charging unit 12 with a constant current source 14. The discharging takes place by means of the connected load 2 and optionally by means of the ballast 17. In this connection the mains voltage 16 is disconnected from the ballast 17 and supplies the ballast from the battery by means of the push-pull converter 18. In this case the control generally takes place by means of the processor 13.

According to the invention a simple circuit is produced for carrying out a cycle test method, by which a battery or also a plurality of batteries are monitored and in the event of a malfunction and in particular decreasing capacity of the battery, the battery is improved with regard to its emergency supply minimum time to the extent that it can again be used in an emergency lighting system in normal operation.

In this connection the described cycle is carried out once and usually several times. This leads to a "self-healing" of the battery. Furthermore, in the event of a battery fault which cannot be remedied, the corresponding malfunction of the battery can be displayed.

The invention claimed is:

1. A cycle test method for at least one rechargeable battery having a single-battery emergency lamp as a load, wherein the battery is connected to a supply device for charging/discharging at a location of use, the method including the following steps:
    i) charging the battery by means of the supply device, wherein the supply device monitors, using an associated temperature measuring device, a temperature of the battery during the charging so that the charging is performed as a function of the temperature;
    ii) interrupting the charging for a specified time in order to lower the temperature of the battery;
    iii) discharging the battery to a specified remaining voltage value, wherein the supply device monitors, using the associated temperature measuring device, the temperature of the battery during the discharging so that the discharging is performed as a function of the temperature; and
    iv) performing steps i) to iii) multiple times,
    wherein steps i) to iv) are carried out after detection of an elapsed time of emergency supply time of the load by the battery, which elapsed time is less than a predetermined emergency supply minimum time.

2. The cycle test method according to claim 1, further comprising arrangement of the battery in a separate housing and connection of the housing to the load by means of explosion-proof contacts and/or design of the supply device with the necessary type of explosion protection.

3. The cycle test method according to claim 1, further comprising detection of the number of batteries and/or battery types by the supply device.

4. The cycle test method according to claim 1, further comprising recording and/or monitoring of battery parameters before, during and after steps i) to iii).

5. The cycle test method according to claim 1, further comprising charging/discharging in steps i) to iii) by means of charging current monitoring and/or charging voltage monitoring of the battery.

6. The cycle test method according to claim 1, further comprising discharging of the battery in step iii) to a cutoff voltage.

7. The cycle test method according to claim 1, further comprising ending of the cycle test method after an emergency supply minimum time is reached and switching over to reuse of the battery for supplying the load in normal operation.

8. The cycle test method according to claim 1, further comprising display of an error message, if after step iv) at least one battery parameter lies outside a predetermined range.

9. The cycle test method according to claim 1, further comprising carrying out of steps i) to iv) only after supply of the battery with mains voltage for a predetermined time.

10. The cycle test method according to claim 1, further comprising design of the supply device with a charging device for the battery and/or a processor and/or a constant current source and/or a display device and/or a battery monitoring device.

11. The cycle test method according to claim 1, further comprising discharging of the battery in step iii) by means of the load.

12. The cycle test method according to claim 1, further comprising capacity-dependent charging of the battery in step i).

13. The cycle test method according to claim 1, further comprising charging of the battery in step i) to full capacity, wherein a capacity of the battery depends upon a charging factor of the battery.

14. The cycle test method according to claim 1, further comprising disconnection in step iii), of a mains voltage from an electronic ballast for supplying a phosphor lamp or a LED module as the load and supplying the electronic ballast from the battery by means of a push-pull converter.

15. The cycle test method according to claim 1, further comprising carrying out a deep discharge before step i) of a first cycle.

* * * * *